(12) United States Patent
Taura et al.

(10) Patent No.: US 6,711,057 B2
(45) Date of Patent: Mar. 23, 2004

(54) NONVOLATILE SEMICONDUCTOR MEMORY DEVICE AND METHOD OF RETRIEVING FAULTY IN THE SAME

(75) Inventors: Tadayuki Taura, Zushi (JP); Shigeru Atsumi, Yokohama (JP); Toru Tanzawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/234,704

(22) Filed: Sep. 5, 2002

(65) Prior Publication Data

US 2003/0090938 A1 May 15, 2003

(30) Foreign Application Priority Data

Sep. 7, 2001 (JP) ........................................ 2001-272073

(51) Int. Cl.[7] .............................................. G11C 16/06
(52) U.S. Cl. ............................ 365/185.09; 365/185.33; 365/189.07; 365/200
(58) Field of Search ..................... 365/185.09, 185.33, 365/189.07, 189.05, 200, 230.03, 230.08

(56) References Cited

U.S. PATENT DOCUMENTS 5,586,075 A * 12/1996 Miwa .................... 365/185.29
6,327,180 B2   12/2001 Taura et al.
6,496,413 B2 * 12/2002 Taura et al. ........... 365/185.09

* cited by examiner

Primary Examiner—Gene Auduong
(74) Attorney, Agent, or Firm—Banner & Witcoff, Ltd.

(57) ABSTRACT

A nonvolatile semiconductor memory device comprises a first memory cell array including electrically re-programmable main memory cells, a second memory cell array including electrically data-programmable redundancy memory cells, a first storage configured to store a specified code, a first comparator configured to compare a selected code with the specified code to generate an activating signal, a faulty address latch circuit configured to be activated by the activating signal and controlled to temporarily latch a fault address corresponding to the fault, a second storage configured to store the faulty address latched by the faulty address latch circuit, a second comparator configured to compare an input address with the faulty address to generate a replacement control signal when the input address coincides with the faulty address, and a replacing circuit configured to replace an output of the first memory cell array with an output of the second memory cell array.

20 Claims, 4 Drawing Sheets

NONVOLATILE SEMICONDUCTOR MEMORY DEVICE AND METHOD OF RETRIEVING FAULTY IN THE SAME

CROSS-REFERENCE TO RELATED APPLICATIONS

This application is based upon and claims the benefit of priority from the prior Japanese Patent Application No. 2001-272073, filed Sep. 7, 2001, the entire contents of which are incorporated herein by reference.

BACKGROUND OF THE INVENTION

1. Field of the Invention

The present invention relates to a nonvolatile semiconductor memory device having a memory element capable of erasing and reprogramming data electrically, and a method of retrieving a faulty in the nonvolatile semiconductor memory device, and more particularly to a semiconductor memory device having means for retrieving if a memory cell has a fault, and its test method, being used, for example, electrically erasable programmable read-only memory (EEPROM).

2. Description of the Related Art

As a memory cell for EEPROM, an NMOS transistor having a two-layer stack gate structure on a double well formed on a semiconductor substrate is formed in order to reduce in size.

FIG. 3 is a sectional view of an example of a cell composed of an NMOS transistor of two-layer stack gate structure.

In the diagram, reference numeral 30 is a P-type substrate (Psub), 31 is an N-type well (Nwell), and 32 is a P-type well (Pwell) formed in the N-type well. In the N-type well 31, a well extracting electrode is formed in an $N^+$-type diffusion layer 33. In the P-type well 32, a source S and a drain D of the NMOS transistor are formed in an $N^+$-type diffusion layer 34, and a well extracting electrode is formed in a $P^+$-type diffusion layer 35.

On the substrate 30, a floating gate FG composed of a polycrystalline silicon layer of first layer is formed on a gate insulating film 36, and a control gate CG composed of a polycrystalline silicon layer of second layer is formed thereon, being separated by an insulating film 37.

In an actual semiconductor memory device, plural cells are arrayed in a matrix on the same well, and it is designed to select a certain cell by a plurality of word lines WL connected to the control gate CG of cell of each row and a plurality of bit lines BL connected to the drain D of cell of each row. Source lines SL are commonly connected to the source S, N-type well 31, and P-type well 32 of all cells.

The operation of the cell is briefly explained.

When erasing data, by applying, for example, 10V to the source line SL, 10V is applied to the source S, N-type well 31, and P-type well 32 of the cell. Further, by applying, for example, −7V to all word lines WL, −7V is applied to all control gates CG. The drain D is in a floating state. At this time, electrons in the floating gate FG are discharged into the channel by FN tunneling. In this state, the threshold of the cell is lowered, and the data in the erase state is called "1".

When writing data, to select a cell desired to write in, any one of the plural word lines WL is set at, for example, 9V, any one of the plural bit lines BL is set at, for example, 5V, and the source line SL is set at 0V. At this time, in the selected cell, electrons are injected into the floating gate FG by hot electron injection. In this state, the threshold of the cell is high, and the data in the write state is called "0".

When reading out data, to select a cell desired to read out, any one of the plural word lines WL is set at, for example, about 5V, any one of the plural bit lines BL is set at a low voltage (for example, about 0.7V), and the source line SL is set at 0V. At this time, when the selected cell is in write state (data "0"), the cell is not turned on, and hence no current flows. By contrast, when the selected cell is in the erase state (data "1"), the cell is turned on, and a cell current of, for example, about 40 $\mu$A flows. The amplitude of this current is amplified by a sense amplifier (not shown) or the like and read out.

In this explanation of operation, the example is a memory cell of NOR type for erasing by applying a high voltage to the substrate side of the memory cell, however, a similar operation control is also possible in other type, such as a memory cell designed to erase by applying a high voltage to the source.

FIG. 4 shows an example of array of a memory chip region formed on a semiconductor wafer. In FIG. 4, one chip region is shown in an enlarged view, and an example of array of pads formed on the chip region is shown.

When manufacturing a semiconductor memory, while patterning each layer for composing a memory on one silicon wafer 40 by step-and-repeat technique, usually, hundreds to thousands of chip regions 41 are formed.

Among all chip regions 41, generally, there are several percent of defective chips not satisfying the desired characteristics due to effects of dust or fluctuations of processing of each layer for composing the memory, and it is hence necessary to sort out defective chips by testing all chip regions. To sort out chips, hitherto, when a defective chip is found, it is replaced by built-in retrieving means to a non-defective chip.

FIG. 5 shows an example of configuration of a conventional EEPROM comprising fault retrieving means in column unit.

A main memory cell array (MMA) 10 has main memory cells 11 arrayed in a matrix, and the main memory cell is selected by a row decoder (RD) 12, a column decoder (CD) 13, and a column selection gate (CG) 14.

A redundancy cell array (RMA) 15 has redundancy memory cells 16 arrayed in a column direction. When there is a faulty memory cell in the main memory cell array 10, the redundancy memory cell 16 is selected by the row decoder 12, redundancy column decoder and redundancy column selection gate (RCG) 17, so that the faulty memory cell in the main memory cell 11 can be replaced (retrieved) with the redundancy memory cell 16.

In reading operation of the main memory cell array 10, the data of the selected main memory cell is connected to j pieces of sense amplifiers (SAj) 19 through j pieces of data lines (DLj) 18 selected by the column selection gate 14, and read data SAOj are outputted.

In reading operation of the redundancy cell array 15, the data of the selected redundancy memory cell 16 is connected to k pieces of redundancy sense amplifiers (RSAk) 21 through k pieces of data lines (RDLk) 20 selected by the redundancy column selection gate 17, and read data RSAk are outputted.

One set of retrieve circuit is composed of a retrieve address memory circuit (RDFUSE) 22, a retrieve address latch circuit (RDLAT) 23, and a fault address detecting circuit (RDHIT) 24, and usually plural sets of retrieve circuits are provided.

The retrieve address memory circuit 22 comprises memory elements of same composition as, for example, the main memory cell 11 or redundancy memory cell 16, and receives an address signal RDADi from an address buffer (ADBF) 25, and is controlled by a write control signal RDPRG to store a retrieve address (i.e., a fault address). The retrieve address latch circuit 23 latches the retrieve address at the time of turning on the power. As the memory element of the retrieve address memory circuit 22, for example, metal fuse element or exclusive memory cell may be used.

The fault address detecting circuit 24 compares output RDi of the retrieve address latch circuit 23 and output RDADi from the address buffer 25. When input of fault address is detected, a column hit signal HITCOL becomes "H", and a replacement information signal HITIO for specifying the redundancy sense amplifier 21 is outputted.

An output multiplexer (MUX) 26 receives the column hit signal HITCOL and replacement information signal HITIO, and replaces output SAOj of the sense amplifier 19 with output RSAOk of the predetermined redundancy sense amplifier 21 to output as DSj. When this DSj is outputted to an external terminal through an output buffer (not shown), the fault address is retrieved in the column unit.

A method of retrieving a faulty in a memory chip region on a wafer shown in FIG. 4 is explained below.

When sorting out the chips, all memory cells on the chip region 41 must be tested for writing, erasing and reading, and the time spent for this test causes to increase the manufacturing cost of the memory. Accordingly, various techniques have been attempted to shorten the memory test time, and one of such techniques is simultaneous testing of plural chip regions 41 on the silicon wafer 40 as one unit.

In the case of sorting test, various tests are conducted with plural probes of a sorting tester (not shown) fitted simultaneously to plural pads on the chip region 41. At this time, by fitting probes simultaneously to plural chip regions 41 of one unit, signals are transmitted from the sorting tester simultaneously to corresponding pads of each chip region 41, and plural chip regions 41 of one unit are tested in parallel operation.

In the sorting tester, the tester main body and tester probes are coupled through a relay circuit (not shown) for controlling connection and disconnection. The chip region 41 judged to be faulty before fault retrieval is disconnected by the relay circuit, and is not tested further, and adverse effects (voltage drop, etc.) of faulty chips are eliminated.

In such sorting test, however, when testing plural chip regions 41 simultaneously and retrieving a fault, writing time of fault address is long, and the test time is long.

That is, since the fault address to be retrieved usually varies in each chip, and the fault address is written in every chip by controlling the relay circuit of sorting tester. At this time, a setting time of about tens of milliseconds is needed every time when changing over the relay circuit.

The chip region 41 usually contains about tens to hundreds of retrieve circuits RDCIR. Assuming, for example, 100 pieces of RDCIR are contained in each chip region, it takes the time of about 10 ms×100 pieces=1 s is needed for writing the fault address into the retrieve address memory circuit RDFUSE of the retrieve circuit RDCIR. As the writing time of each address, for example, the time of about 100 $\mu$s is needed individually.

Further, as mentioned above, in the testing method of sending signals simultaneously to the chip regions 41 in a state in which tester probes are fitted simultaneously to plural chip regions 41 of one unit, individual chip regions 41 cannot be tested independently, and simultaneous measurement is impossible in the case of requirement of different controls in each chip region 41 as in the case of writing of fault address.

To test individual chip regions 41 independently, it is possible by connecting the relay circuit to one chip region 41 only, but it not only leads to increase of test time, but also requires modification or purchase of testers, and hence the manufacturing cost is increased.

In the conventional EEPROM, as mentioned above, if attempted to measure plural chip regions simultaneously for retrieving faults in the wafer stage, the writing time of fault address for fault retrieval is long, the test time is long, and hence the manufacturing cost is higher.

BRIEF SUMMARY OF THE INVENTION

According to a first aspect of the present invention, there is provided a nonvolatile semiconductor memory device comprising a first memory cell array including a plurality of electrically re-programmable MOS type main memory cells arranged in a matrix form, the plurality of main memory cells being selected according to an input address; a second memory cell array including a plurality of electrically data-programmable MOS type redundancy memory cells arranged in at least row or column of the matrix form, the plurality of redundancy memory cells being selected according to a redundancy address; a first storage configured to be write-controlled by a first write control signal in a specified mode, which stores a specified code inputted from outside; a first comparator configured to compare a selected code inputted from outside in the specified mode with the specified code stored in the first storage to generate an activating signal when the selected code coincides with the specified code; a faulty address latch circuit configured to be activated by the activating signal generated by the first comparator, the defective address latch circuit being controlled by a latch control signal when a fault is generated in the first memory cell array in the specified mode, to temporarily latch a fault address corresponding to the fault; a second storage configured to be write-controlled by a second write control signal in the specified mode, which stores the faulty address latched by the latch circuit; a second comparator configured to compare the input address with the faulty address storing in the second storage to generate a replacement control signal when the input address coincides with the faulty address; and a replacing circuit configured to be controlled by the replacement control signal to replace an output of the first memory cell array with an output of the second memory cell array.

According to a second aspect of the present invention, there is provided a method of retrieving a faulty in a nonvolatile semiconductor memory device defined in the first aspect, comprising, when a plurality of the nonvolatile semiconductor memory devices are provided on a plurality of chip regions of a semiconductor substrate and the nonvolatile semiconductor memory devices on those of the chip regions to be collective-tested are subjected to collective testing to detect and retrieve faults, allocating specified codes correspondingly to the those chip regions before the collective-test is started.

According to a third aspect of the present invention, there is provided a nonvolatile semiconductor memory device comprising a memory cell array including a plurality of electrically re-programmable MOS type main memory cells arranged in a matrix form, the main memory cells being selected according to an input address; a first storage configured to be write-controlled by a first write control signal, which stores a specified code inputted from outside; a first comparator configured to compare a selected code inputted from outside in a specified mode with the specified code stored in the first storage to generate an activating signal when the selected code coincides with the specified code; a latch circuit configured to be activated by the activating signal generated by the first comparator, to temporarily latch data of each chip region; and a second storage configured to be write-controlled by a second write control signal, which stores the data of each chip region latched by the latch circuit

DETAILED DESCRIPTION OF THE INVENTION

Figure 1:
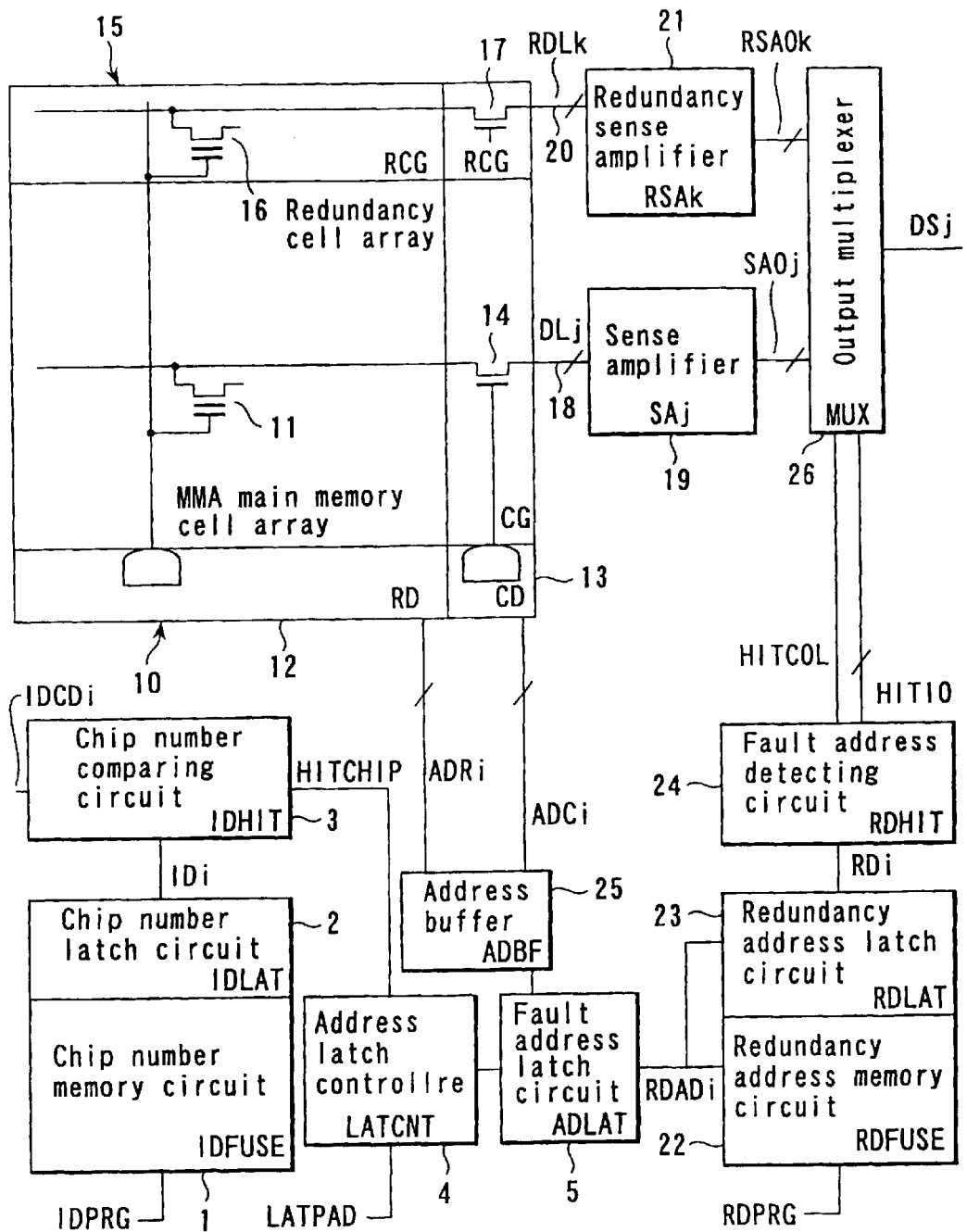
FIG. 1 is a block diagram showing an example of chip configuration of a nonvolatile semiconductor memory device, especially EEPROM, according to an embodiment of the present invention.

Referring now to the drawings, a preferred embodiment of the invention is described in detail below.

FIG. 1 is a block diagram showing part of an EEPROM according to an embodiment of the invention.

Figure 5:
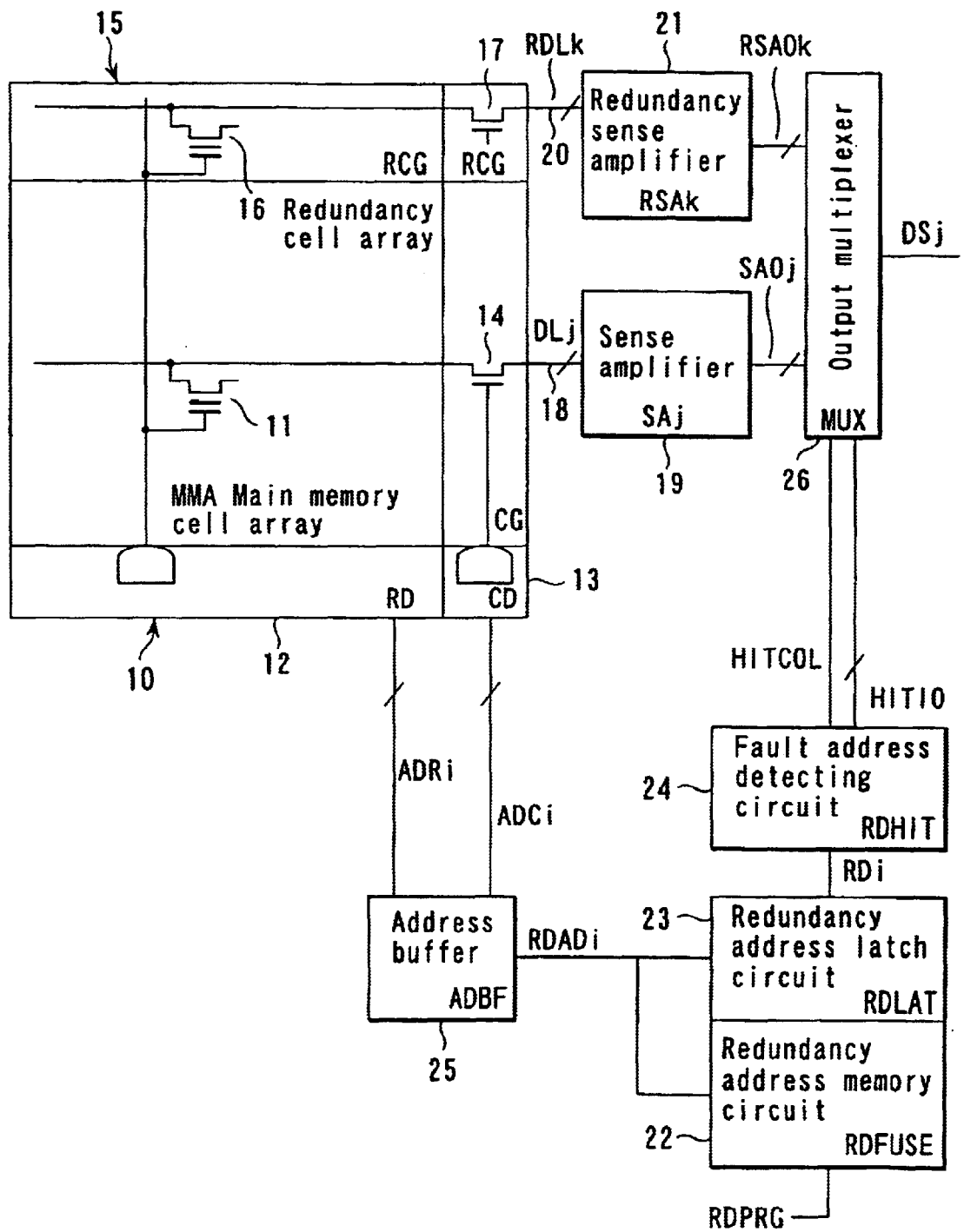
FIG. 5 is a block diagram showing an example of configuration of a conventional EEPROM comprising fault retrieving means in column unit.

The configuration of the EEPROM shown in FIG. 1 is similar to the configuration of the EEPROM shown in FIG. 5, except that (1) chip number memory circuit (IDFUSE) 1, (2) chip number latch circuit (IDLAT) 2, (3) chip number comparing circuit (IDHIT) 3, (4) address controller 1 (LATCNT) 4, and (4) fault address latch circuit (ADLAT) 5 are added, and other parts are same as in FIG. 5, and are identified with same reference numerals.

In the EEPROM shown in FIG. 1, a main memory cell array (MMA) 10 which is a first memory cell array has main memory cells 11 of MOS structure capable of reprogramming data electrically disposed in a matrix. The memory cell 11 is selected by a row decoder (RD) 12 for decoding input address, a column decoder (CD) 13, and a column selection gate (CG) 14. Data of simultaneously selected main memory cells 11 are connected to j pieces of sense amplifiers (SAj) 19 through j pieces of data lines (DLj) 18, so that read data SAOj are outputted in the word unit or page unit.

The row decoder 12 and column decoder 13 receive address signals from an address buffer (ADBF) 25 which receives an address signal from an external terminal.

A second memory cell array, that is, a redundancy cell array (RMA) 15 has k pieces of redundancy memory cells 16 of MOS structure capable of reprogramming data electrically at least in one direction of row or column (column direction in this example). In this example, the redundancy memory cell 16 is selected by the row decoder 12, redundancy column decoder (not shown), and redundancy column selection gate (RCG) 17, depending on the fault address (retrieve address) of the main memory cell 11, in order to replace (retrieve) the main memory cell 11 in the column unit if a fault is present in the main memory cell 11. Data of the selected redundancy memory cell 16 is connected to redundancy sense amplifier (RSAk) 21 through retrieve cell reading data line (RDLk) 20, and read data RSAOk is outputted.

In this example, as first memory means for storing the specific code (chip number in this example) inputted from outside assigned in each chip at the time of test, a chip number memory circuit (IDFUSE) 1 is provided for storing the chip number as writing is controlled by a first write control signal. A chip number latch circuit (IDLAT) 2 is provided as required for latching the chip number stored in this chip number memory circuit 1.

Comparing the selection code to be inputted through an external input circuit (not shown) from outside at the time of test and the chip number stored in the chip number memory circuit 1 (latched in the chip number latch circuit 2), as first comparing means for generating an activation signal by detection of coincidence, a chip number comparing circuit (IDHIT) 3 is provided.

As the activation is controlled by the activation signal, an address latch control circuit (LATCNT) 4 is provided for outputting a start pulse to be inputted from an external terminal for start pulse input LATPAD as latch pulse.

A fault address latch circuit (ADLAT) 5 is provided for latching the output (fault address) of the address buffer 25 in case a fault occurs in the main memory cell 12, temporarily by the latch pulse.

Further, as writing is controlled by a second write control signal RDPRG at the time of test, as second memory means for storing output RDADi (fault address, retrieve address) of the fault address latch circuit 5, a retrieve address memory circuit (RDFUSE) 22 and a retrieve address latch circuit (RDLAT) 23 for latching the retrieve address are provided. The retrieve address memory circuit 22 contains the memory element of the same configuration as, for example, main memory cell 11 or redundancy memory cell 16.

As second comparing means for comparing the retrieve address RDi stored in the retrieve address latch circuit 23 and output (input address) of the address buffer 25, a fault address detecting circuit (RDHIT) 24 is provided. This fault address detecting circuit 24, when detecting coincidence, activates (turning "H") a column hit signal HITCOL as replacement control signal, and also generates a replacement information signal HITIO for specifying the sense amplifier 19 to be replaced.

Further, an output multiplexer (MUX) 26 is provided as means for replacing the output of the main memory cell array 10 with the output of the redundancy cell array 15 by the replacement control signal. This output multiplexer 26 receives the column hit signal HITCOL and replacement information signal HITIO, and replaces the output SAOj of the sense amplifier 19 with the output SAOk of the specified redundancy sense amplifier 21, and outputs as DSj. When this DSj is outputted to an external terminal through an output buffer (not shown), the fault address is replaced in the column unit.

One set of retrieve circuit is composed of the retrieve address memory circuit 22, retrieve address latch circuit 23, and fault address detecting circuit 24, and usually plural sets of retrieve circuits are provided.

Figure 2:
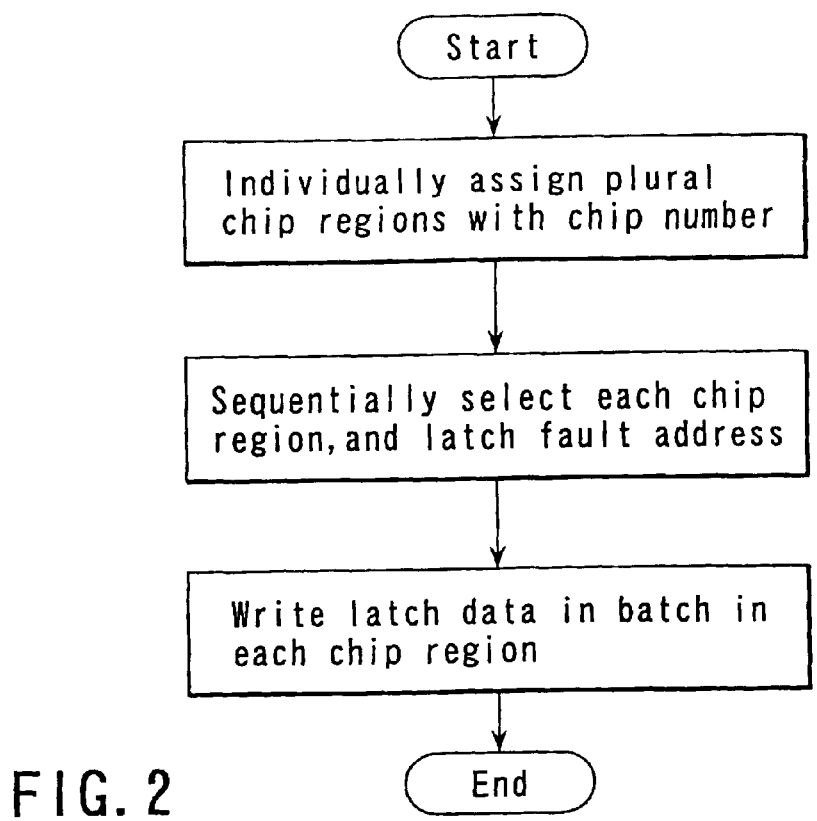
FIG. 2 is a flowchart showing an example of a method of retrieving a faulty of the EEPROM shown in FIG. 1.
Figure 3:
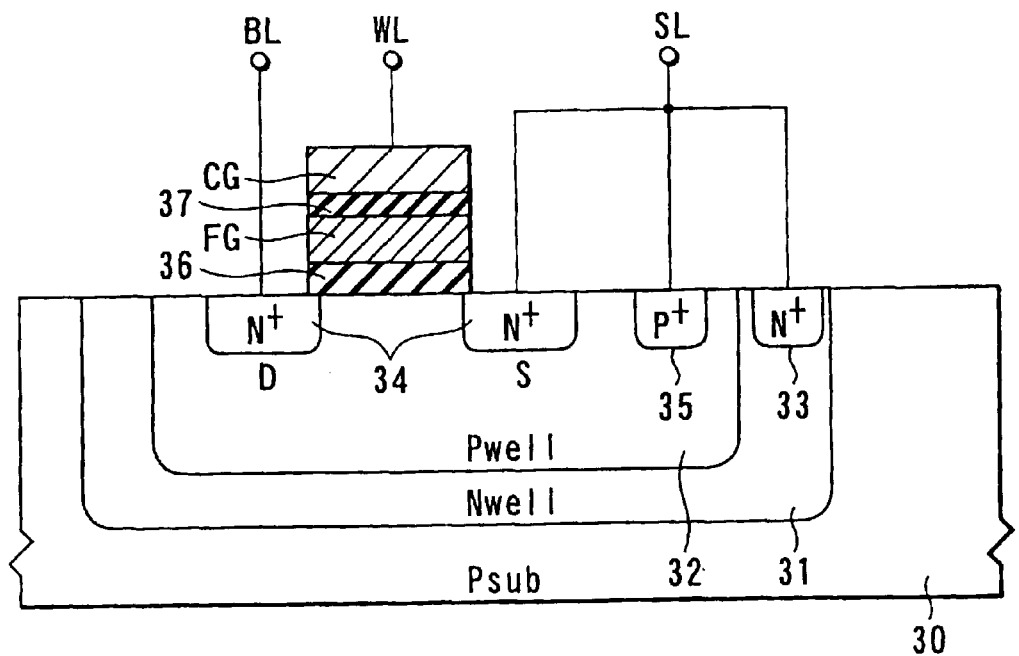
FIG. 3 is a sectional view showing an example of cell composed of an NMOS transistor in two-layer stack gate structure.
Figure 4:
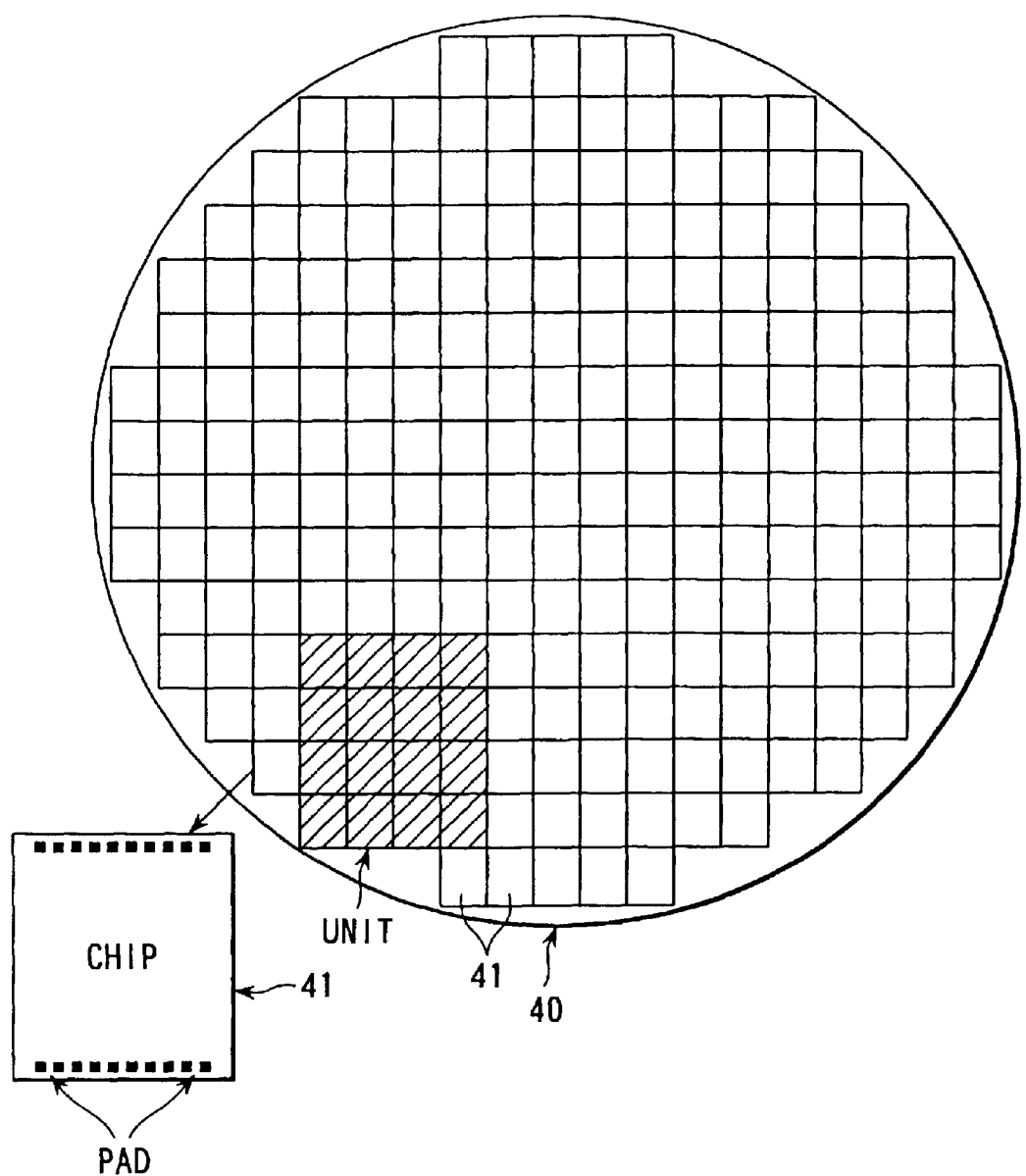
FIG. 4 is a diagram showing an example of array of memory chip regions formed on a semiconductor wafer and an example of pad array when one chip region is taken out and shown in an enlarged view.

FIG. 2 is a flowchart showing an example of a method of retrieving a faulty of the EEPROM shown in FIG. 1.

First, when starting a sorting test, plural chip regions 41 to be measured at the same time are assigned with an identification number (chip number) IDINi, and the chip number IDINi is written into the chip number memory circuit 1, and latched in the chip number latch circuit 2.

As a result, during the test, a sort number (chip code IDCDi) is inputted from an external terminal, and only when matched with the chip number stored inside, it is possible to control in the unit of chip regions 41.

That is, a sorting test is carried out in the plural chip regions 41 to be measured at the same time. When a faulty cell is detected, the fault address and sorting number IDCDi of the faulty cell are sequentially inputted, for example, from an external terminal, and this sorting number IDCDi and the chip number IDINi written in preliminarily are compared in the chip number comparing circuit 3.

In the chip region 41 matched as a result of comparison, the output signal HITCHIP of the chip number comparing circuit 3 becomes an active state "H", and the address latch control circuit 4 is activated. By contrast, in the chip region 41 not matched as a result of comparison, the HITCHIP is in an inactive state "L", and the address latch control circuit 4 is not activated.

At this time, when a start pulse is inputted from an external terminal for latch pulse input LATPAD, in the activated region 41, a fault address is latched in the fault address latch circuit 5 by the output signal of the address latch control circuit 4.

By executing the same operation sequentially by varying the sorting number IDCDi sequentially in the plural chip regions 41 to be measured simultaneously, the fault addresses of each chip region 41 are latched sequentially. Later, by operating the retrieve circuits in batch by a write activating signal RDPRG, the write operation can be executed in batch. When there are plural fault addresses in the chip region 41, the same operation is repeated.

In this procedure, for example, when 64 chip regions 41 are measured simultaneously, assuming the latch of each fault address to be 500 ns, writing into the retrieve address memory circuit 22 to be 100 $\mu$s, and the number of address to be 100, the writing time per piece is (0.5 $\mu$s×64+100 $\mu$s)/64×100=206.25 $\mu$s.

That is, according to the EEPROM of the embodiment, when retrieving a fault in a wafer state, in the case of simultaneous measurement of plural chip regions 41, by assigning each chip region 41 with a chip number IDINi, individual control is possible in the unit of chip regions 41. Therefore, if many and different fault addresses are written in the unit of chip regions 41, not required to write in each chip, batch writing is possible, and the test time is greatly shortened, and the manufacturing cost can be suppressed.

In the EEPROM of the embodiment, fault addresses of each chip region are written in batch in plural chip regions to be measured simultaneously, however the individual data of each chip region, for example, the data to be written in for determining the specification of the number of output bits (×8 pieces, ×16 pieces, etc.) can be latched in each chip region, and written in batch.

Also in the EEPROM of the invention, batch writing is attempted in plural chip regions to be measured simultaneously, however, as required, plural chip regions may be divided into plural groups, and it may be designed to write in the group unit.

According to the EEPROM of the invention, the retrieve address memory circuit 22 is made of a memory element of the same composition as the main memory cell 11, and the retrieve address can be stored again, and it is effective when desired to change the retrieve address. Similarly, by using the memory element of the same composition as the main body memory 11 in the chip number memory circuit 1, the chip number can be stored again, and it is effective when repeating the test plural times.

The invention is not limited to the EEPROM of the embodiment, however, may be generally applied to non-volatile semiconductor memory devices.

As described herein, according to the nonvolatile semiconductor memory device and a method of retrieving a faulty in the nonvolatile semiconductor memory device according to an embodiment of the present invention, when desired to measure plural chip regions simultaneously in order to retrieve a fault in a wafer state, the writing time of fault address for retrieving a fault can be shortened, and the test time is shortened, and the manufacturing cost can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a first memory cell array including a plurality of electrically re-programmable MOS type main memory cells arranged in a matrix form, the plurality of main memory cells being selected according to an input address;
   a second memory cell array including a plurality of electrically data-programmable MOS type redundancy memory cells arranged in at least row or column of the matrix form, the plurality of redundancy memory cells being selected according to a redundancy address;
   a first storage configured to be write-controlled by a first write control signal in a specified mode, which stores a specified code inputted from outside;
   a first comparator configured to compare a selected code inputted from outside in the specified mode with the specified code stored in the first storage to generate an activating signal when the selected code coincides with the specified code;
   a faulty address latch circuit configured to be activated by the activating signal generated by the first comparator, the defective address latch circuit being controlled by a latch control signal when a fault is generated in the first memory cell array in the specified mode, to temporarily latch a fault address corresponding to the fault;
   a second storage configured to be write-controlled by a second write control signal in the specified mode, which stores the faulty address latched by the latch circuit;
   a second comparator configured to compare the input address with the faulty address storing in the second storage to generate a replacement control signal when the input address coincides with the faulty address; and
   a replacing circuit configured to be controlled by the replacement control signal to replace an output of the first memory cell array with an output of the second memory cell array.

2. The nonvolatile semiconductor memory device according to claim 1, further comprising:
an address buffer configured to receive the input address inputted from outside and supply the input address to the faulty address latch circuit and the second comparator; and
a control circuit adapted to receive the activating signal generated by the first comparator and the latch control circuit to control the faulty address latch circuit.

3. The nonvolatile semiconductor memory device according to claim 1, in which a plurality of sets of the second memories, the second comparators and the replacing circuits are provided.

4. The nonvolatile semiconductor memory device according to claim 2, in which a plurality of sets of the second memories, the second comparators and the replacing circuits are provided.

5. The nonvolatile semiconductor memory device according to claim 1, in which the first storage includes a memory element in which the specified code is re-storable.

6. The nonvolatile semiconductor memory device according to claim 2, in which the first storage includes a memory element in which the specified code is re-storable.

7. The nonvolatile semiconductor memory device according to claim 3, in which the first storage includes a memory element in which the specified code is re-storable.

8. The nonvolatile semiconductor memory device according to claim 4, in which the first storage includes a memory element in which the specified code is re-storable.

9. The nonvolatile semiconductor memory device according to claim 1, in which the second storage includes a memory element having a structure the same as the memory cells of the memory cell arrays, in which the faulty address is re-storable.

10. The nonvolatile semiconductor memory device according to claim 2, in which the second storage includes a memory element having a structure the same as the memory cells of the memory cell arrays, in which the faulty address is re-storable.

11. The nonvolatile semiconductor memory device according to claim 3, in which the second storage includes a memory element having a structure the same as the memory cells of the memory cell arrays, in which the faulty address is re-storable.

12. The nonvolatile semiconductor memory device according to claim 4, in which the second storage includes a memory element having a structure the same as the memory cells of the memory cell arrays, in which the faulty address is re-storable.

13. The nonvolatile semiconductor memory device according to claim 5, in which the second storage includes a memory element having a structure the same as the memory cells of the memory cell arrays, in which the faulty address is re-storable.

14. The nonvolatile semiconductor memory device according to claim 6, in which the second storage includes a memory element having a structure the same as the memory cells of the memory cell arrays, in which the faulty address is re-storable.

15. The nonvolatile semiconductor memory device according to claim 7, in which the second storage includes a memory element having a structure the same as the memory cells of the memory cell arrays, in which the faulty address is re-storable.

16. The nonvolatile semiconductor memory device according to claim 8, in which the second storage includes a memory element having a structure the same as the memory cells of the memory cell arrays, in which the faulty address is re-storable.

17. A method of retrieving a faulty in a nonvolatile semiconductor memory device defined in claim 1, comprising, when a plurality of the nonvolatile semiconductor memory devices are provided on a plurality of chip regions of a semiconductor substrate and the nonvolatile semiconductor memory devices on those of the chip regions to be collective-tested are subjected to collective testing to detect and retrieve faults, allocating specified codes correspondingly to said those chip regions before the collective-test is started.

18. A method of retrieving a faulty in a nonvolatile semiconductor memory device, according to claim 17, in which the faulty address is stored in an address latch circuit in a chip region the specified code allocated to which coincides with the selected address, while the selected codes are successively allocated to said those of the chip regions, and the faulty addresses are collectively written in the second storage of the chip regions according to the second write control signal.

19. A nonvolatile simiconductor memory device comprising:
a memory cell array including a plurality of electrically re-programmable MOS type main memory cells arranged in a matrix form, the main memory cells being selected according to an input address;
a first storage configured to be write-controlled by a first write control signal, which stores a specified code inputted from outside;
a first comparator configured to compare a selected code inputted from outside in a specified mode with the specified code stored in the first storage to generate an activating signal when the selected code coincides with the specified code;
a latch circuit configured to be activated by the activating signal generated by the first comparator, to temporarily latch data of each chip region; and
a second storage configured to be write-controlled by a second write control signal, which stores said data of each chip region latched by the latch circuit.

20. A nonvolative semiconductor memory device according to claim 19, in which said data of each chip region is data for determining a specification of the number of output bits.

* * * * *